United States Patent [19]

Lifshin et al.

[11] 4,431,710

[45] Feb. 14, 1984

[54] LAMINATE PRODUCT OF ULTRA THIN COPPER FILM ON A FLEXIBLE ALUMINUM CARRIER

[75] Inventors: Eric Lifshin, Loudonville, N.Y.; Margo E. Gill, Mountain View, Calif.

[73] Assignee: General Electric Company, Schenectady, N.Y.

[21] Appl. No.: 499,019

[22] Filed: May 27, 1983

Related U.S. Application Data

[63] Continuation-in-part of Ser. No. 227,290, Jan. 22, 1981, abandoned.

[51] Int. Cl.$^3$ ............................................. B32B 15/20
[52] U.S. Cl. ................................. 428/650; 428/606; 428/607; 428/620; 428/629; 428/632; 428/652; 428/674
[58] Field of Search ............... 428/650, 606, 607, 620, 428/629, 632, 652, 674

[56] References Cited

U.S. PATENT DOCUMENTS 3,969,199 7/1976 Berdan et al. ..................... 204/32 R
3,984,598 10/1976 Sarazin et al. ...................... 428/336
4,193,849 3/1980 Sato .................................. 204/38 B
4,357,395 11/1982 Lifshin et al. ...................... 428/607
4,383,003 5/1983 Lifshin et al. ...................... 428/624

FOREIGN PATENT DOCUMENTS 990692 4/1965 United Kingdom .
1355927 6/1974 United Kingdom .
1370893 10/1974 United Kingdom .

OTHER PUBLICATIONS

Pellegrino News Item (Electronics Packaging and Production, vol. 18, No. 11, p. 125, Nov. 1978).
"Advantages of Thin Copper Foils for the Manufacture of Printed Circuit Boards", D. E. L. Dyke and T. I. Murphy, Insulation/Circuits, Mar. 1979, pp. 11–16.

*Primary Examiner*—Veronica O'Keefe
*Attorney, Agent, or Firm*—Leo I. MaLossi; James C. Davis, Jr.; James Magee

[57] ABSTRACT

A copper-clad laminate having special utility in the production of high resolution printed circuit patterns is made by a method which includes as the step of forming an initial copper film by vapor depositing copper directly in contact with an as-rolled aluminum carrier sheet at temperature between about 100° C. and 250° C. so that the carrier release peel strength has an average value between about 0.5 and 2.0 pounds per inch.

6 Claims, 3 Drawing Figures

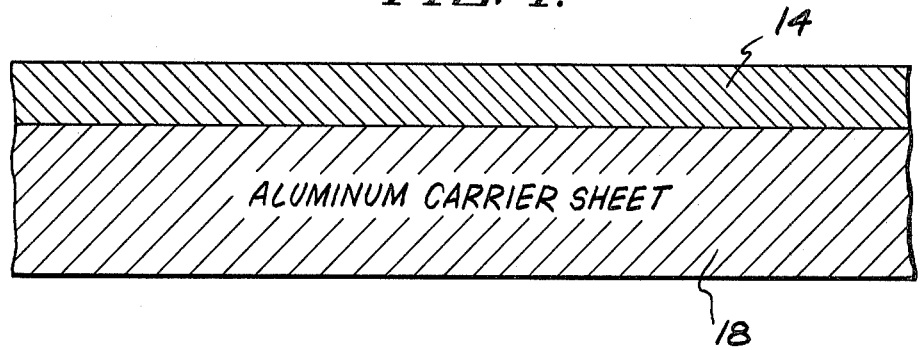
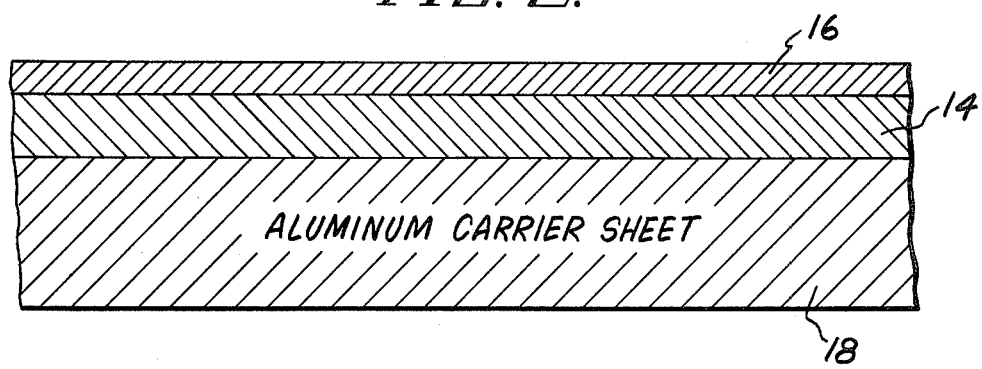
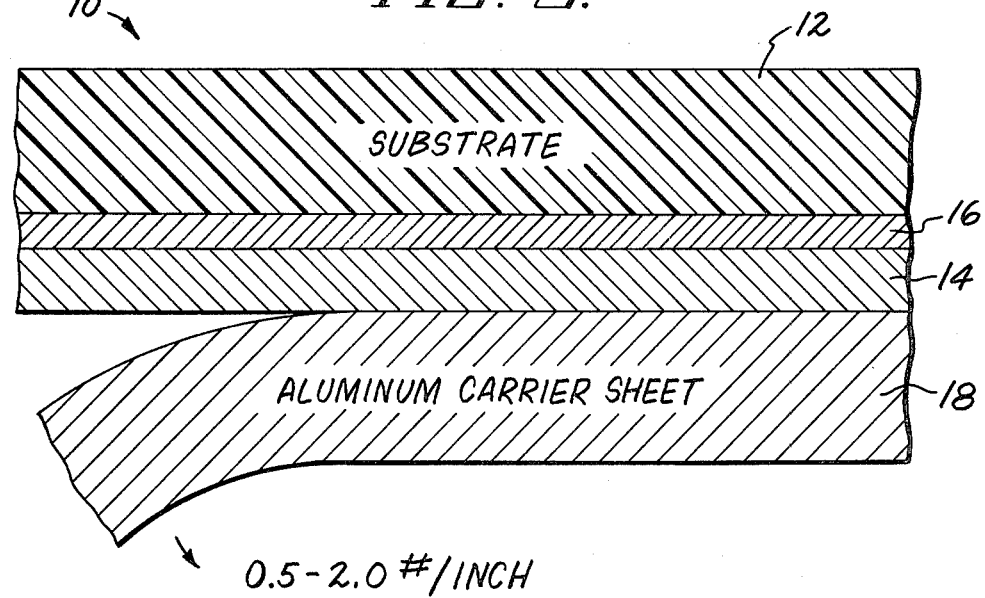

LAMINATE PRODUCT OF ULTRA THIN COPPER FILM ON A FLEXIBLE ALUMINUM CARRIER

This is a continuation-in-part of U.S. Patent Application Ser. No. 227,290—Lifshin and Gill, filed Jan. 22, 1981, now abandoned.

FIELD OF THE INVENTION

The present invention relates generally to laminated materials and is more particularly concerned with a novel copper-clad laminate having special utility in the production of high-resolution printed circuit boards and with a new method for making those products.

CROSS REFERENCES

This invention is related to that disclosed and claimed in co-pending patent application Ser. No. 180,341—Lifshin et al., filed Aug. 22, 1980 (now U.S. Pat. No. 4,357,395), entitled "Transfer Lamination of Vapor Deposited Foils". Thus, the extremely smooth, virtually pinhole-free and fine-grained copper surfaces of the copper-clad laminates produced by the process of that invention are features of importance in the products of the preferred practice of the present invention.

The invention disclosed and claimed herein is also related to that disclosed and claimed in co-pending patent applications Ser. No. 189,003—Lifshin et al., filed Sept. 22, 1980 now U.S. Pat. No. 4,383,003, entitled "Transfer Lamination of Vapor Deposited Foils" and Ser. No. 406,588—Green et al. entitled "Metal-Clad Laminate Construction" filed Aug. 9, 1982. The above patent applications and patent are assigned to the assignee hereof and all are incorporated by reference.

DEFINITIONS

As used herein, and in the appended claims, the term "carrier" includes aluminum sheet material which is of gauge thickness such that it can be run through a processing line and rolled for storage or shipment, and also includes such sheet material of other metals, such as copper. The terms "aluminum" and "copper" in referring to carrier sheet material will include aluminum alloys and copper alloys, respectively. Any carrier employed must retain sufficient strength at the temperature of deposition of the copper film to preserve the integrity of the film-carrier sheet combination through subsequent processing including substrate attachment. The carrier should also be substantially inert, and bondable, to copper from which it can later be mechanically stripped without damaging the copper film in accordance with the practice of this invention. "Bondable surface area" means and includes that portion of the surface area of the carrier sheet occupied by naturally-occurring oxide(s) or exposed carrier metal.

"Chemically clean" when applied to commercial aluminum foil indicates that the hydrocarbon contamination (e.g. due to the presence of drawing lubricants used during cold reduction passes in the preparation of aluminum foil from aluminum billets) has been substantially reduced by the use of chemical cleaning. Typically, such cleaning of aluminum foil begins with vapor degreasing in a solvent, such as trichloroethylene, followed by cleaning with an appropriate aqueous solution of an alkaline cleaner and, finally, a pressurized water rinse. Determinations of hydrocarbon contamination on chemically clean aluminum have established average residual hydrocarbon contamination in the range of from about 0.3 to about 1.0 $\mu g/cm^2$ (micrograms per square centimeter).

"Ultra-thin" designates thickness less than about 16 microns.

"Film" and "foil" in this same context mean, respectively, an ultra-thin coating and the combination of such coating and one or more ultra-thin coatings of another metal or other material.

"Vapor deposition" means and includes sputtering, physical evaporation (i.e., electron beam, inductive and/or resistive evaporation), chemical vapor deposition, and ion plating.

"Substrate", as that term is used in this specification and the appended claims, means and refers to that part of a copper-clad circuit board laminate or other article of manufacture of this invention, which serves as the physical support means for the copper film or foil. Typically the substrate is a glass-epoxy body provided in the form of a prepreg to be cured in contact with the copper foil. Other materials useful for this purpose include, but are not limited to, that known in the trade as "phenolic paper resins" which are paper sheet products impregnated with a resin curable to provide an adhesive bond between the substrate and the metal foil of the laminate. Still other such materials are polyimides and polyester resins.

"Peel strength" is indicated as being the measurement of force in pounds required to separate, for example, a 1-inch wide strip of the carrier sheet from the copper film (the copper film being anchored to the substrate) when pulled at an angle of 90°. Regardless of the actual lineal width of strip pulled during the test, this parameter is expressed in lbs/lineal inch.

BACKGROUND AND SUMMARY OF THE INVENTION

Foils for copper-clad laminates suitable for printed circuit board production have heretofore been made, for the most part, by electrodeposition. The many advantages of this method, including speed of production, economy and a very well developed technology, are, however, offset to a substantial extent by certain disadvantages. A very important disadvantage is the difficulty of producing pinhole-free foils of less than 16 microns thickness. Another is the inherent environmental impact of electrodeposition practice. While the pinhole problem may be minimized to some degree by electroplating copper on an aluminum carrier surface specially prepared in accordance with the procedure described in U.S. Pat. No. 3,969,199 to Berdan and Luce, it is at the expense of substantially increased processing complexity and cost. In the Berdan et al. process in order to obtain a peel strength that is not in excess of about 2.0 lb./in. the aluminum carrier surface is first given a zincate coating, the zincate coating is substantially all removed by contact with acid and then over-plated with a metal, such as zinc.

These shortcomings of the prior art can be avoided through the use of the inventions disclosed and claimed in the above-referenced co-pending patent applications. They can now also be avoided in still another different way represented by the process of the present invention. Thus, instead of coating the carrier surface with a metal (i.e. zinc or indium as in Berdan et al) or some other release agent prior to laying down the copper film, the copper is deposited directly on the bare carrier surface in such a way as to enable subsequent non-destructive release of the film from the carrier. In other words, this invention enables elimination of the release agent layer while retaining its function. This is accomplished through control of the film bonding action involved in depositing copper on the carrier. This invention, thus, is based upon our new concept of vapor depositing copper on a carrier under conditions of carrier surface temperature, roughness and cleanliness, such as will result in a virtually pinhole-free, high quality, copper film, which is bonded to the carrier but releasable therefrom upon application of peeling or stripping force within an acceptable range. As a general rule, according to this invention, the carrier surface will be clean and free from adhering oil and dirt, which would impair adequate bonding or contaminate the resulting copper film, and will be relatively smooth and free from gross physical irregularities. Further, the temperature of the carrier surface will, in accordance with this invention, be between about 100° and about 250° C. so that bonds which are strong enough but not too strong are formed between the copper film and the carrier surface.

It is a particularly important objective of this invention to be able to utilize commercially available aluminum foil as the carrier sheet in the preparation of the laminate precursor leading to the manufacture of copper-clad assemblies for ultimate usage in the preparation of printed circuit boards.

None of the commercially available foil strong enough to be used for this purpose is completely free of hydrocarbon contaminants. The contamination of aluminum foil begins during the rolling of aluminum billets to produce aluminum foil. The rolling is done in several passes each reducing the aluminum thickness by approximately 50 percent. Each such cold reduction pass is followed by a stress relief anneal to avoid tearing and pitting of the aluminum during the next reduction. Drawing lubricants are used during the cold reductions, the most popular being the combination of kerosene and mineral oil.

Fully soft aluminum foil is desired in many applications and in making foil for such applications the drawing lubricant can be burned off by heating to 300° C. or even higher. However, in the case of aluminum foil for use as a carrier sheet, retention of the mechanical properties is important. Foil thicknesses employed as carrier sheets are of the order of 0.002 inch thick and must be strong enough to be used in roll form in an unrolling and rerolling operation carried on with a fixed tension. In order to avoid tearing, when such carrier sheet material is separated from the completed copper-clad assembly, it is preferable that the yield strength of the aluminum carrier sheet not be less than about 10,000 psi. This latter, therefore, limits the techniques employable for driving off the surface-contaminating hydrocarbons.

Commercially available chemically cleaned aluminum foil is particularly attractive for this commercially available material retains the full hardness of unannealed severely cold worked aluminum foil. The problem remains, however, that aluminum foil so cleaned still retains on its surfaces a minimum of 0.3 $\mu g/cm^2$ of hydrocarbon contaminants, which is enough to rule out van der Waals adsorption as a reliable adhesional force between vapor deposited copper and the aluminum carrier sheet on which it is deposited. It is, therefore, necessary to develop other adhesional forces to provide sufficient peel strength in order to have the aluminum foil/copper layer laminate remain intact until it is desired to remove the aluminum by peeling it away. By the practice of this invention it becomes practical to develop such adhesional forces using this commercially available aluminum foil "as received".

We have found in the course of using this invention that electron beam evaporation is an especially satisfactory method of carrying out the copper deposition step, carrier surface temperature being readily controllable in various ways under such condition and a film of requisite thickness being quickly established uniformly over the carrier surface as required. We also contemplate, however, the possibility of ion plating deposition of the copper film, which would involve biasing the carrier and, if required, introducing an inert gas such as argon into copper vapor to establish the necessary ionization effect. Again, in the case of ion plating, carrier surface temperature would be amenable to easy control by a variety of alternatives. Induction (RF) evaporation of the copper instead of electron beam evaporation is also contemplated as a means of producing the vapor phase copper required for physical vapor deposition and again, of course, carrier surface temperature would be readily controllable. If, however, sputtering is the method of deposition to be carried out in the practice of this invention, it will be necessary for special heat removal measures to be taken so as to maintain carrier surface temperature in the range necessary to limit the development of bonding strength to the range we have found to be critical to the new results and advantages of this invention.

It will be understood by those skilled in the art that in whatever manner the invention is carried out to provide the copper film on the carrier surface, thereafter one has the choice of proceeding to produce the laminated body.

In brief summary, then, the method of this invention comprises the steps of forming a copper film on a carrier by vapor deposition of copper directly on the carrier surface at a temperature between about 100° C. and about 250° C., depositing a substrate bonding layer over the copper film, joining the resulting laminate to a substrate by means of strong adhesion between the said laminate and the substrate and, finally, removing the carrier leaving the exposed surface of the unified copper film/substrate. In accordance with the invention of patent application Ser. No. 180,341, the substrate bonding layer may be an electrolytically deposited film, which is preferably of copper and, in any event, is so produced as to have or provide a nodular or dendritic surface formed to promote substrate bonding. Alternatively, the substrate bonding layer may be an electrolytically deposited ultra-thin film of zinc, aluminum, tin or chromium overlaid with an ultra-thin film or silicon dioxide or aluminum oxide, as set forth in patent application Ser. No. 189,003 now U.S. Pat. No. 4,383,003. However, the preferred substrate bonding layer comprises a metal oxide layer and a coupling agent layer as is disclosed and claimed in Ser. No. 406,588.

BRIEF DESCRIPTION OF THE DRAWINGS

FIG. 1 is a schematic diagram representing a cross-sectional view of an intermediate laminate product of this invention;

FIG. 2 is a view like that of FIG. 1 of the intermediate laminate product of this invention with a bonding layer applied thereto, and FIG. 3 is a view like that of FIG. 1, after the copper film has been bonded to the substrate, illustrating the step of removing the carrier sheet by stripping.

DETAILED DESCRIPTION OF THE INVENTION

As illustrated in FIG. 3, a product 10 of this invention as it may appear as an item of commerce for ultimate use in, for example, the production of printed circuit boards, comprises a substrate 12 having a vapor-deposited copper film 14 bonded to the surface thereof by an electrolytically deposited or otherwise established bonding layer 16. It also includes carrier sheet 18, preferably of aluminum, on which the vapor-deposited copper film 14 had initially been deposited in the key novel step of the process of this invention to produce the laminate product shown in FIG. 1. The copper-clad laminate product of FIG. 1 can also be an item of commerce. Vapor deposition of copper film 14 is conducted under conditions, which will permit ultimate separation of sheet 18 from film 14 by peeling or stripping by the application of force of such small magnitude as not to tear sheet 18 or copper film 14, which is to be configured later as a printed circuit.

In those instances in which as-rolled aluminum sheet product, rather than chemically clean commercial aluminum foil, is the starting material, the process of this invention in its preferred form involves as a first step the cleaning of the carrier sheet. Whether the carrier sheet (aluminum or copper) is as-rolled or is chemically clean, the intent of this invention is to avoid or minimize chemical modification of its surface to prepare bondable surface area, as would result from etching, treatment with zincate solution or other such severe exposure.

Any aluminum or copper sheet will typically have over its surfaces a naturally-formed coating of oxide(s) of the metallic constituents of the sheet. In the case of aluminum, this oxide coating will be something less than about 50-Angstroms in thickness and, in usual practice, from 10 to 30-Angstroms thick. The carrier sheet itself is preferably 1 to 7 mils thick, but can be somewhat thinner or much thicker, if desired, and it will have surface finish better than ± eight microinches root mean square. Cleaning of the carrier sheet to adequately reduce hydrocarbon contamination at some point in time after the commercial rolling operation is essential to the production of uniform laminate product in which the copper film is adhered to the aluminum sheet with a peel strength having an average value between 0.5 and 2.0 pounds per inch as is desirable for subsequent processing and utilization. Fume-cleaning with Freon liquid or other suitable material can be useful but we prefer plasma etching or ozone cleaning, which are techniques known and established in the art for general cleaning purposes, where a consistently high degree of surface cleanliness is required.

With the surface of the carrier sheet thus prepared, the application of copper by vapor deposition technique, as described above, is conducted whereby a film of copper is applied to the clean aluminum carrier sheet surface. In accordance with our preference, electron beam evaporation is used and, in any case, the step is carried out to provide a coating which may be ultra-thin or somewhat thicker, up to 25 microns, as desired. This coating of copper will be uniformly thick, continuous, smooth, and pinhole-free at about 100 percent of theoretical density with a discernable columnar structure. As deposited in this manner, or by some alternative method such as with induction heating or by ion plating, the copper film will have an average grain size of the order of from a few hundred to a few thousand Angstroms in contrast to the much larger grain size of electroplated copper films running on the order of one to two microns as a minimum.

To achieve this result, the aluminum carrier sheet surface on which the copper film is deposited, is maintained throughout the deposition operation at a temperature from about 100° to 250° C. Temperatures somewhat higher have been found to result in the establishment of a bond between the copper film and the aluminum carrier sheet, which is strong enough to make mechanical stripping or peeling of the film from the sheet difficult or impossible without damage to the film. On the other hand, somewhat lower temperatures have been found to result in inadequate bonding to maintain copper film-aluminum carrier integrity through subsequent processing steps.

With the establishment of the copper film by vapor deposition technique completed, the resulting laminate assembly is ready for the next step of the process. This involves preparing the copper film for attachment to a substrate and this step may be carried out in accordance with the process disclosed and claimed in above-referenced patent (U.S. Pat. No. 4,357,395), by the process disclosed and claimed in Ser. No. 189,003 now U.S. Pat. No. 4,383,003 or by the process disclosed and claimed in Ser. No. 406,588. It will be understood, however, that it may be otherwise treated by present or future methods to accomplish the ultimate desired result in respect to the bonding of the copper film to the substrate body with which it is ultimately to be laminated and used in the production of printed circuit boards or for other purposes. At this time, the procedure of Ser. No. 406,588 is preferred.

Substrate bonding having been carried out to produce the finished laminated product, it only remains for the ultimate user to remove the carrier sheet by mechanically stripping or peeling it away by the application of force (i.e. between about 0.5 and 2.0 pounds per inch) such as will not damage either the carrier sheet or which is non-destructive in respect to the integrity of the copper film.

The following illustrative, but not limiting, examples are offered in further exposition of the special new features and advantages of the present invention:

EXAMPLE I

Three 3-mil aluminum carrier sheets in as-rolled condition were plasma-etch cleaned and clamped to a 4 by 4-inch glass plate (¼ inch thick) and a thermocouple was attached to one edge of the sheet in each instance. By means of two six-inch quartz lamps disposed on either side of the assembly in a vacuum chamber, the temperature of the carrier sheet in each instance was brought to, and maintained at, 300° C., while pressure in the chamber was reduced to $8 \times 10^{-7}$ torr. Then, through the use of an electron beam device, a 5-micron film of copper was vapor deposited on the exposed surface of the aluminum sheet. During the 10 minute period that the copper was being melted, vacuum chamber pressure was $3.6 \times 10^{-6}$ torr. Then, during the evaporation stage, the pressure was $6 \times 10^{-6}$ torr. The temperature of the aluminum sheet was maintained at 300°±5° C. throughout the 45-minute deposition stage of the process. On test, the peel strength of one of the copper film specimens was found to be 3.04 pounds per inch. The second specimen was nodularized in a copper sulfate bath at one ampere per square inch for 30 seconds and pressed onto an FR4 epoxy glass board at 160 pounds per square inch pressure and 166° C. for 35 minutes as disclosed in the aforesaid application Ser. No. 189,003. The peel test performed on the carrier sheet by cutting a one-eighth inch strip from the edge resulted in the copper film being pulled away from the board and thus destroying the composite body for its intended printed circuit board production use.

The third specimen was joined to the substrate and the assembly was then heated at 300° C. for 45 minutes with the consequence that the copper annealed with the aluminum forming a composite, which could not be cleanly separated by peeling or stripping.

EXAMPLE II

In still another experiment like that of Example I, except that the carrier sheet was Freon fume-cleaned, the temperature of the aluminum/copper laminate was maintained at about 120° C. throughout the copper deposition period. This test was performed as described in the Example I by assembling the copper film coated carrier sheet (provided with the bonding layer) and substrate, as described in Example I. The test then, for peel strength, was made on a one-eighth inch strip cut from the specimen, a peel testing device being used as in the Example I for measurement of the peel strength. The peel strength of the copper film was found to be 1.6 pounds per inch.

EXAMPLE III

In still another test like that of Example II, Freon fume-cleaned aluminum carrier sheet of 3-mil thickness was used; the other conditions for deposition of the copper film and production of the assembly (i.e. comprising substrate, copper film and carrier) being the same. It was found on test carried out in the manner described above that the peel strength exhibited between the carrier and the copper film was zero. A preliminary peel strength test carried out on the film prior to assembly with the substrate also gave a zero reading.

EXAMPLE IV

In another experiment like that of Example II, except that the temperature of the carrier sheet was maintained at 250° C. throughout the copper film deposition period, it was found on test of the assembly (i.e. removing a strip of carrier) that the peel strength was between 0.88 and 1.00 pound per inch.

EXAMPLE V

Another experiment like that of Example II resulted in peel strengths of 1.4 pound per inch and 1.76 pound per inch, when the temperature of the aluminum carrier sheet was maintained at 260° C. throughout the copper film deposition period and other conditions were unchanged.

EXAMPLE VI

In another experiment like that of Example V, except that the carrier temperature was maintained at 240° C. throughout the deposition period, the peel strength in one instance measured 0.24 pound per inch, while in another, it was 0.48 pound per inch and in still another, it was 0.80 pound per inch.

In another recent experiment, we prepared a 0.3 micron vapor-deposited film of copper or an uncleaned, as-rolled aluminum sheet at room temperature. The peel strength of that film proved to be zero.

It is evident from the data developed in the experiments described above that the new results and advantages of this invention can be obtained under certain circumstances which are critical in substantial degree. It is thus clear that the temperature at which the carrier sheet surface is maintained during the copper film deposition period is vitally important to the strength of the bond formed between the copper film and the aluminum carrier. Further, it is apparent that the nature of the surface of the aluminum carrier sheet on which the copper film is deposited has an important bearing upon the strength of that bond. Finally, it is clear from these experiments that the cleanliness of the surface of the carrier sheet on which the copper film is established has an important bearing upon peel strength of the bond and, of course, also can be important in respect to the contamination of the resulting copper film and the value and utility of the ultimate laminate product. The cleaning process we favor is the plasma-etch cleaning technique known in the art. The Freon evaporation and other fume-cleaning processes produce variable results as is evident from the data reported above, and is consequently not favored in the best practice of this invention.

The particular manner by which temperature control is effectuated during copper film deposition will depend upon the particular mode of deposition. Thus, in the case of electron beam evaporation it is preferred to pass the carrier sheet over a rotating chill roll and have the evaporated copper impinge on the carrier sheet at the location at which the back surface of the carrier sheet is in close contact with the chill roll to maximize heat transfer. With this arrangement the temperature gradient providing the desired carrier surface temperature can be determined by controlling the temperature of coolant (e.g. water) circulated into and out of the chill roll.

What is claimed is:

1. A laminate product as an article of commerce comprising a flexible aluminum carrier sheet/copper film combination consisting of said carrier sheet and a substantially pinhole-free vapor deposited ultra-thin film of copper in contact with and covering one major surface of said carrier sheet and adhering thereto by direct bonding action between the copper and bondable surface area of said major surface providing a release peel strength between about 0.5 and about 2.0 pounds per inch, said bondable surface area being at least in part naturally occurring oxide coating less than about 50-Angstroms thick.

2. The laminated product of claim 1 in which the carrier sheet is rolled aluminum, the surface of which has a finish better than plus or minus 8.0 microinches root mean square.

3. The laminated product of claim 1 in which the average hydrocarbon contamination of the major surface of the carrier sheet is in the range of from about 0.3 to about 1.0 microgram per square centimeter.

4. A laminate product of claim 1 wherein the grains of copper in the copper film are predominantly columnar.

5. A laminated product of claim 1 wherein the copper film is disposed between and bonded both to the carrier sheet and to an insulating substrate, the strength of the bond between said copper film and said substrate being significantly greater than 2.0 pounds per inch.

6. A laminated product of claim 5 wherein the carrier sheet is chemically clean aluminum, the copper film is ultra-thin and the substrate is of glass-reinforced epoxy.

* * * * *